(12) United States Patent
Sowlati et al.

(10) Patent No.: US 6,448,855 B1
(45) Date of Patent: Sep. 10, 2002

(54) ACCURATE POWER DETECTION CIRCUIT FOR USE IN A POWER AMPLIFIER

(75) Inventors: Tirdad Sowlati, Ossining; Sifen Luo, Hartsdale, both of NY (US)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/548,726

(22) Filed: Apr. 13, 2000

(51) Int. Cl.[7] .............................. H03G 3/10; H03G 3/20; H03F 3/16
(52) U.S. Cl. .................. 330/279; 330/140; 330/300
(58) Field of Search ............................. 330/140, 279, 330/300

(56) References Cited

U.S. PATENT DOCUMENTS

| | | | |
|---|---|---|---|
| 3,152,250 A | 10/1964 | Platzer | 235/193 |
| 4,538,198 A | 8/1985 | Imanishi et al. | 361/86 |
| 5,083,096 A | * 1/1992 | Miyazaki | 330/279 |
| 5,467,058 A | 11/1995 | Fujita | 330/267 |
| 5,530,922 A | * 6/1996 | Nagode | 330/279 |
| 5,724,003 A | * 3/1998 | Jensen et al. | 330/140 |

FOREIGN PATENT DOCUMENTS

EP  0772273 A1  7/1997  ............ H02H/9/00

* cited by examiner

Primary Examiner—Robert Pascal
Assistant Examiner—Patricia Nguyen
(74) Attorney, Agent, or Firm—Steven R. Biren

(57) ABSTRACT

A power amplifier circuit for amplifying an input signal includes an amplifying transistor and a power detection circuit. The power detection circuit includes a circuit for generating a signal which is directly proportional to the power level in the amplifying transistor. This may-be accomplished by generating a voltage proportional to the square of a current in the amplifying transistor and then averaging that voltage. In this manner, a more accurate indication of the power level in the amplifying transistor is obtained.

6 Claims, 2 Drawing Sheets

ACCURATE POWER DETECTION CIRCUIT FOR USE IN A POWER AMPLIFIER

BACKGROUND OF THE INVENTION

The invention is in the field of transistor amplifier circuits, and relates more particularly to power amplifier circuits and power detection circuits for such power amplifier circuits.

Amplifiers of this general type are frequently used in high-frequency RF amplifiers, such as those used in wireless communications apparatus, as well as in audio amplifiers and other applications. In such amplifiers, particularly when used in RF applications, it is desirable to provide an indication of the power in the output stage.

In the prior art, this function is typically accomplished by one of two techniques. First, a directional coupler or voltage divider may be provided at the output of the power amplifier to sense a fraction of the signal applied to the load, and this sample signal is then used to indicate the power in the load. The second technique used in the prior art generates a sample of the current in the power amplifier by using a smaller transistor in parallel with the power transistor. The sample current is then fed off-chip, where it is averaged and used to provide an approximate indication of the power in the load.

However, there are various drawbacks inherent in the prior-art solutions. Thus, for example, directional couplers are bulky and lossy, resistive dividers are inefficient, and using a current sample as a measure of output power is relatively inaccurate.

Accordingly, it would be desirable to have a power detection circuit for a power amplifier circuit which is compact, efficient, easy to implement, and more accurate than prior-art power detection circuits.

SUMMARY OF THE INVENTION

It is therefore an object of the present invention to provide a power detection circuit for use in a power amplifier circuit which is compact and efficient in design, easy to implement, and which provides a more accurate indication of amplifier power than prior-art circuits.

In accordance with the invention, these objects are achieved by a new power detection circuit for use in a power amplifier circuit having an amplifying transistor, in which the power detection circuit includes a circuit for generating a signal which is directly proportional to a power level in the amplifying transistor.

In a preferred embodiment of the invention, this is done by providing a circuit for generating a voltage proportional to the square of a current in the amplifying transistor and averaging this voltage to provide an indication of this power level in the amplifying transistor.

In a further preferred embodiment of the invention, a wireless communications device having an RF power amplifier circuit is provided with a power detection circuit for generating a signal which is directly proportional to the power level in the amplifying transistor.

In further preferred embodiments of the invention, the power detection circuit may be implemented using a simple MOS transistor configuration, or a translinear circuit using bipolar transistors which is more complex than the MOS circuit but which provides greater accuracy.

A power detection circuit in accordance with the present invention offers a significant improvement in that a particularly advantageous combination of features, including a compact and efficient design, and more accurate performance, can be obtained in an economical and easily-implemented configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
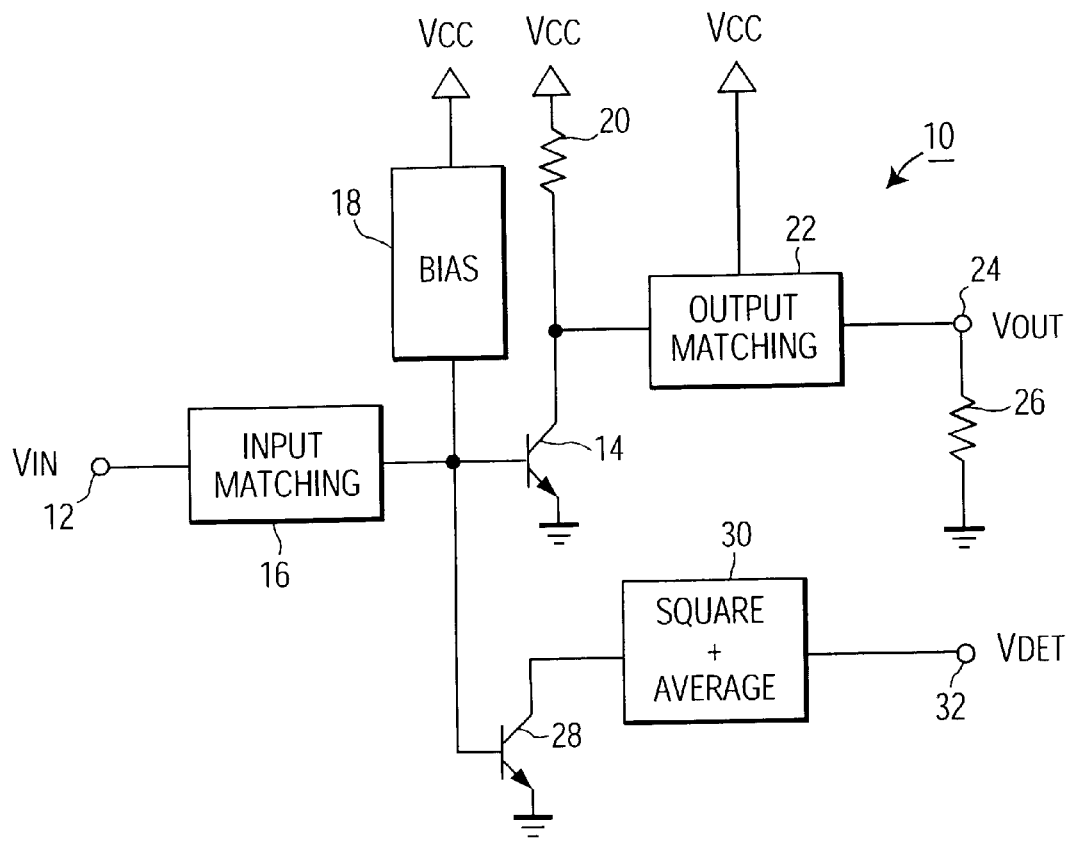
FIG. 1 shows a simplified partially-block and partially-schematic diagram of a power amplifier circuit having a power detection circuit in accordance with the invention.

A power amplifier circuit 10 for amplifying an input signal $V_{IN}$ at an input terminal 12 is shown in simplified partially-block and partially-schematic form in FIG. 1. The power amplifier circuit includes an amplifying transistor 14 for amplifying the input signal $V_{IN}$ provided to the base of the transistor 14 from the input terminal 12 through an input matching network 16. It should be noted that the power amplifier circuit may be used in various applications, such as audio amplification, or RF amplification in such areas as wireless communication and internet connection, so that the input signal $V_{IN}$ may be either an audio or RF input signal. The power amplifying transistor 14 is biased from the power supply voltage $V_{CC}$ by a bias network 18. It is to be understood that circuit portions such as input matching network 16 and bias network 18 which are shown in block-diagram form can be implemented by various known circuit configurations familiar to those of ordinary skill in this art, and are accordingly not described in further detail herein.

The output circuit of power amplifier 10 is shown in simplified form as including a collector resistor 20 and an output matching network 22 for providing an output voltage $V_{OUT}$ at output terminal 24 to supply power to a load symbolically illustrated by resistor 26.

In accordance with the invention, a proportional sample of the current in the power amplifier transistor 14 is obtained by using a smaller transistor 28 having its base-emitter circuit connected in parallel with that of the power amplifying transistor 14. However, unlike prior-art circuits, which utilize the output of transistor 28 directly to obtain a relatively inaccurate measure of power, the present invention uses a squaring and averaging circuit 30, having its input coupled to the output of transistor 28, in order to generate a voltage which is proportional to the square of the current in sensing transistor 28, and then averaging this voltage. Circuit 30 generates an output signal $V_{DET}$ at terminal 32 which is directly proportional to the power level in the amplifying transistor 14 and which is a substantially more accurate representation of this power level than can be obtained using the prior-art technique, since the power level is proportional to the mean square of the current level in the amplifying transistor. This technique permits the implementation of a power detection circuit which can be integrated on the same die as the power amplifier circuit and which can generate a voltage which is an accurate representation of the power in the amplifying transistor in a relatively simple manner.

Figure 2:
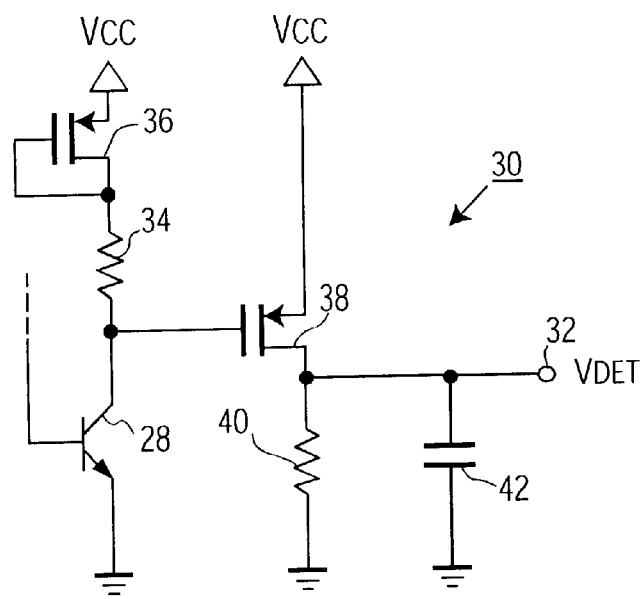
FIG. 2 shows a simplified schematic diagram of a power detection circuit in accordance with a first embodiment of the invention.

A particularly simple and compact MOS implementation of the squaring and averaging circuit 30 is shown in FIG. 2. In this figure, sense transistor 28 has a base connection (as shown by the vertical dashed line) to the base of transistor 14, as shown more fully in FIG. 1, and has its collector coupled to $V_{CC}$ by a series connection of a resistor 34 and a diode-connected PMOS 36. The collector of sense transistor 28 is also coupled to the gate of a second PMOS transistor 38, with transistor 36 serving to generate a threshold voltage for transistor 38 and the current through resistor 34 generating a voltage applied to the gate of transistor 38 to generate a squared current in transistor 38. This squared current is passed through resistor 40 to generate a detector output voltage $V_{DET}$ at terminal 32 which is directly proportional to the power level in the amplifying transistor. In order to provide the averaging function in circuit 30, a capacitor 42 is provided in parallel with resistor 40 to form a simple RC averaging circuit, so that the detector output voltage $V_{DET}$ is an averaged signal which accurately represents the power level in the amplifying transistor. It is to be understood, however, that other types of known averaging circuits may be employed.

Figure 3:
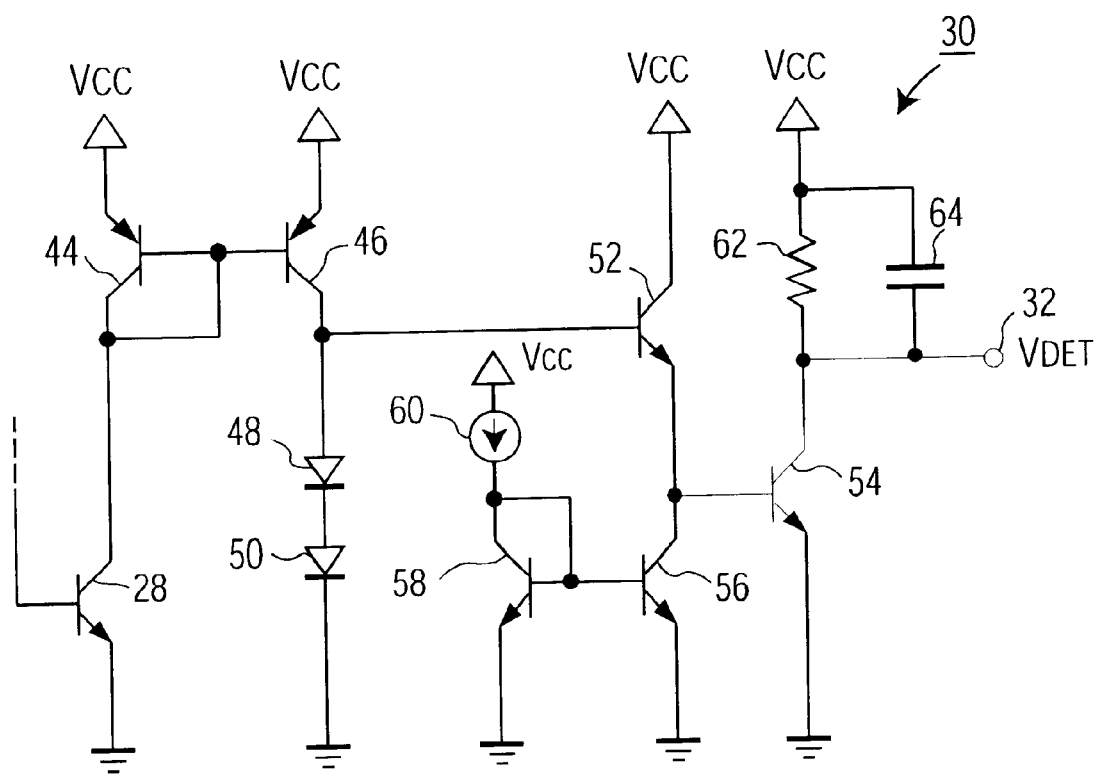
FIG. 3 shows a schematic diagram of a power detection circuit in accordance with a second embodiment of the invention.

A second embodiment of the power detection circuit, using a bipolar implementation with a translinear circuit, is shown in FIG. 3. This embodiment is less compact and more complex than the embodiment of FIG. 2, but offers the additional advantage of still greater accuracy.

In this embodiment, sense transistor 28 has its base connected as in FIGS. 1 and 2, and has its collector coupled to a current mirror composed of bipolar transistors 44 and 46 connected in a conventional current-mirror configuration. The collector of transistor 46 is connected both to a series connection of diodes 48 and 50 and to the base of transistor 52. The emitter of transistor 52 is connected to the base of transistor 54 and to the collector of transistor 56, which, in combination with transistor 58 and current source 60, forms a second current mirror. Within the circuit as so far described, diodes 48 and 50 and transistors 52 and 54 form a translinear circuit configuration in which the sum of the voltages across the two diodes is equal to the sum of the voltages across the two base-emitter junctions of transistors 52 and 54, and in which the product of the currents in the two transistors is equal to the product of the current in the two diodes. This results in the current in transistor 54 being proportional to the square of the current in sense transistor 28 divided by the current in transistor 52. Since the current in transistor 52 is substantially equal to the current provided by current source 60, the circuit output can be made more accurate, for example by selecting the value of current source 60 to compensate for temperature variations in the circuit.

The power detection circuit output signal $V_{DET}$ is generated at terminal 32 by passing the current in transistor 54 through resistor 62, and a capacitor 64 is provided in parallel with resistor 62 to create a simple RC averaging circuit (although other types of averaging circuits may be employed) so that the output $V_{DET}$ represents an averaged signal which more accurately represents the power level in the amplifying transistor.

In this manner, the present invention provides a power detection circuit for a power amplifier circuit suitable for use in RF or audio amplifiers, in which an output is generated which is directly proportional to the power level in the amplifying transistor. Circuits in accordance with the invention are compact, efficient, easily implemented and provide a signal which more accurately represents the power level in the amplifying transistor than do prior-art circuits.

While the invention has been particularly shown and described with reference to several preferred embodiments thereof, it will be understood by those skilled in the art that various changes in form and detail may be made without departing from the spirit or scope of the invention. Thus, for example, different types of power amplifying circuits, sensing circuits, squaring circuits and averaging circuits may be employed as appropriate, and alterations to the circuit configurations shown may be made to suit particular design requirements.

What is claimed is:

1. A power amplifier circuit for amplifying an input signal and comprising an amplifying transistor and a power detection circuit, said power detection circuit comprising a circuit for generating a signal which is directly proportional to a power level in said amplifying transistor, wherein said circuit for generating a signal comprises a circuit for generating a voltage proportional to the square of a current in said amplifying transistor.

2. A power amplifier circuit as in claim 1, wherein said circuit for generating a signal further comprises a circuit for averaging said voltage proportional to the source of the current in said amplifying transistor.

3. A power amplifier circuit as in claim 1, wherein said circuit for generating a signal comprises a sense t ransistor having a control terminal connected in parallel with an input terminal of said amplifying transistor and an output terminal, and an MOS transistor having a control terminal coupled to said output terminal of said sense transistor and an output terminal for providing said signal which is directly proportional to the power level in said amplifying transistor.

4. A power amplifier circuit as in claim 1, wherein said circuit for generating a signal comprises a sense transistor having a control terminal connected in parallel with an input terminal of said amplifying transistor and an output terminal, and a translinear circuit comprising bipolar transistors and having an input terminal coupled to said output terminal of said sense transistor and an output terminal for providing said signal which is directly proportional to the power level in said amplifying transistor.

5. A wireless communications device having an RF power amplifier circuit for amplifying an input signal and comprising an amplifying transistor and a power detection circuit, said power detection circuit comprising a circuit for generating a signal which is directly proportional to a power level in said amplifying transistor, wherein said circuit for generating a signal comprises a circuit for generating a voltage proportional to the square of a current in said amplifying transistor.

6. A power detection circuit for use in a power amplifier circuit for amplifying an input signal and comprising an amplifying transistor, the power detection circuit comprising a circuit for generating a signal which is directly proportional to a power level in the amplifying transistor, wherein said circuit for generating a signal comprises a circuit for generating a voltage proportional to the square of a current in said amplifying transistor.

* * * * *